(12) United States Patent
Hojabri et al.

(10) Patent No.: US 7,893,858 B2
(45) Date of Patent: Feb. 22, 2011

(54) EDC ARCHITECTURE

(75) Inventors: Pirooz Hojabri, San Jose, CA (US);
Jack Lam, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/398,926

(22) Filed: Mar. 5, 2009

(65) Prior Publication Data

US 2010/0225519 A1  Sep. 9, 2010

(51) Int. Cl.
*H03M 1/34* (2006.01)

(52) U.S. Cl. .................. 341/158; 341/161

(58) Field of Classification Search ............. 341/161, 341/155, 156, 120, 118
See application file for complete search history.

(56) References Cited

U.S. PATENT DOCUMENTS 6,674,389 B2 *  1/2004  Bult ..................... 341/159
6,950,051 B2 *  9/2005  Lee et al. .............. 341/161

* cited by examiner

*Primary Examiner*—Joseph Lauture
(74) *Attorney, Agent, or Firm*—Stattler-Suh PC

(57) ABSTRACT

A method and apparatus for performing pipelined capacitive folding and interpolation analog-to-digital conversion. In one embodiment, the apparatus comprises a multistage pipelined analog-to-digital converter having: a distributed sample/hold and preamp, folding and interpolation unit which combines a plurality of preamplified signals using a capacitive folding and capacitive interpolation; and a decoding unit coupled to decode the output signals from the folding and interpolation unit. The distributed sample/hold and preamp drastically improves the input dynamic range and hence increases ADC over all linearity. This technique offers an inherent dynamic offset cancellation in every sample and can be implemented in submicron CMOS, using the core digital supply.

15 Claims, 6 Drawing Sheets

EDC ARCHITECTURE

FIELD OF THE INVENTION

The present invention is directed toward folding/interpolating analog-to-digital converter (ADC) circuits; more particularly, the present invention relates to a pipelined capacitive folding and capacitive interpolation ADC.

BACKGROUND OF THE INVENTION

In a conventional analog-to-digital converter, an analog signal is converted to a number of bits, typically between 4 bits and 10 bits. The number of bits in digital may be determined by a number of factors, which include the accuracy and precision required, the cost of components, the required processing speed, available chip real-estate, and the like.

Various types of systems have been provided in the prior art for converting an input analog voltage to digital signals (currents or voltages) representative of such input analog voltage. One type of system, very often used in the prior art to provide such conversion, is known as a flash converter. In a flash converter, an analog input signal (representing the analog value to be converted digitally) is introduced to a first input of a differential amplifier in each of multiple of repetitive cells. An individual one of a plurality of progressive fractions in a reference voltage is introduced to a second input of a respective differential amplifier.

A subranging analog to digital converter (ADC) architecture is suitable for implementing high-performance ADC's. The demand for low-power devices and the ever increasing operation frequencies in ADC calls for ADC designs with a reduced number of power consuming comparators, such as a subranging ADC. In a flash ADC, a common technique is used to convert an analog input signal into an eight bit (8-b) digital output code. In general, flash, folding and subranging ADCs use cascades of distributed amplifiers to amplify the residue flash, folding and subranging ADCs use cascades of distributed amplifiers to amplify the residue signals before they are applied to comparators. These residue signals are obtained by subtracting different DC reference voltages from an input signal $V_{in}$. The DC reference voltages are generated by the resistive ladder biased at a certain DC current. Two implementation aspects of averaging that should be distinguished are circuit implementation and topology.

With respect to circuit implementation, various ideas have been published in the literature, e.g., connecting resistors between amplifier outputs, and connecting capacitors between amplifier inputs. Interpolation is a type of averaging, and additional published techniques include capacitive interpolation, active interpolation using differential pairs, active interpolation using current mirrors, and active interpolation using current splitting.

Alternatively, in bipolar technology, the folding and interpolation technique has proven to be successful for high sample rates. Several references investigate the possibilities of usage of this technique in CMOS. The major advantage of folding and interpolation lies in the field of high sample rate in combination with low power consumption and small chip area. The folding converter requires little power to drive the input, compared to other converters. For similar reasons the power consumption of the reference ladder of the folding converter can be kept low.

SUMMARY OF THE INVENTION

A method and apparatus for performing pipelined capacitive folding and interpolation analog-to-digital conversion. In one embodiment, the apparatus comprises a multistage pipelined analog-to-digital converter having: a distributed sample/hold and preamplifier, a folding and interpolation unit that combines a plurality of preamplified signals using a capacitive folding and capacitive interpolation; and a decoding unit coupled to decode the output signals from the folding and interpolation unit. The distributed sample/hold and preamplifier improve the input dynamic range and hence increase ADC over all linearity. This technique offers an inherent dynamic offset cancellation in samples and can be implemented in submicron CMOS, using the core digital supply.

BRIEF DESCRIPTION OF DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
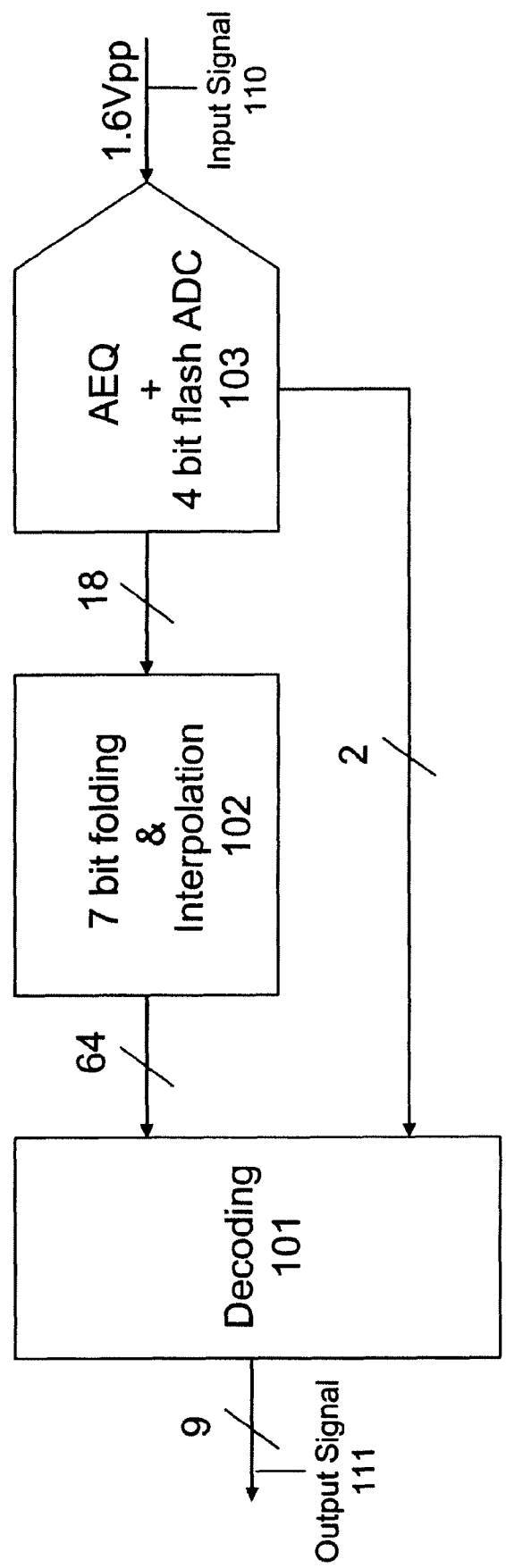
FIG. 1 is a block diagram of one embodiment of a folding and interpolation ADC.

Pipelined capacitive folding and capacitive interpolation ADC architecture is described. In one embodiment, the capacitive folding combines several preamplified signals within a flash type ADC into one signal. When performing capacitive folding, a capacitive folder performs charge sharing. More specifically, the capacitive folder is implemented by properties of capacitor charge sharing with two inputs coupled positively and the third input coupled negatively. Together with capacitive interpolation, this enables a multistage fully pipelined analog-to-digital conversion approach from sample and hold to latch output. Circuit offsets are conveniently removed by input offset sampling in this scheme. It also inherits other benefits of pipelining.

In one embodiment, parallel analog signal processing applies signal conditioning in conjunction with a flash or subranging ADC to decrease the linearity requirement for circuit implementation of a signal conditioner. In this arrangement, a large input voltage range (e.g., 1.6 $V_{in}$) is broken down into smaller sections (e.g., 200 mV) by subtracting the input voltage from a number of reference voltages. The resulting differences are then applied to signal conditioning circuits individually in a parallel fashion. The linearity requirement for each of the individual signal conditioning circuits is decreased in comparison to that required to process the entire input signal as is because the input range for each of the individual signal conditioner is smaller.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

An apparatus comprising a multistage pipelined analog-to-digital converter is described. In one embodiment, this ADC comprises multiple sample and hold circuits, a folding and interpolation unit, and a decoding unit. The sample and hold circuits to store a plurality of preamplified signals generated from input signals. The folding and interpolation unit is coupled to the sample and hold circuits to combine preamplified signals using a capacitive folding and capacitive interpolation. The decoding unit is coupled to decode the output signals from the folding and interpolation unit. The sample and hold circuits, the folding and interpolation unit and the decoding unit operate in a pipelined manner to convert the input signals from analog input voltages to digital outputs.

In one embodiment, the capacitive folding combines the preamplified signals using a first set of capacitive folders, wherein each capacitive folder has a node charged by a plurality of capacitors using capacitive charge sharing in which first and second inputs are coupled positively to their respective capacitors charging the node and the third input is coupled negatively to its respective capacitor charging the node. In another embodiment, the third input is a differential signal and is coupled negatively by having its connections with respect to its respective capacitor flipped with respect to the connections of the first and second inputs to their respective capacitors.

In one embodiment, the ADC further comprises a signal conditioner coupled to the sample and hold circuits, where the signal conditioner has: an input to receive a signal with an input voltage, multiple subtractors to subtract in parallel the input voltage from a plurality of reference voltages to produce a plurality of voltage differences, and signal conditioning circuits coupled to individual difference voltages to perform signal conditioning on the individual difference voltages.

An Example of an ADC Architecture

FIG. 1 is a block diagram of one embodiment of a folding and interpolation ADC. Referring to FIG. 1, an input signal 110 is received by AEQ+4 bit flash ADC unit 103. In one embodiment, input signal 110 is a 1.6Vpp signal. Note that the present invention is not limited to operating on input signals with a 1.6 Vpp signal.

AEQ+4 bit flash ADC unit 103 performs AEQ followed by an analog-to-digital conversion using a flash architecture. The flash architecture uses $2^n-1$ comparators to directly measure the analog signal to a resolution for n bits. Flash architectures are well-known in the art. Note that the present invention is not limited to a 4-bit flash ADC; a subranging ADC or a flash ADC other than a 4-bit flash ADC. In one embodiment, the output of AEQ+4 bit flash ADC unit 103 is 18 bits (where the $2^N-1$ comparators produce 15 bits and the other three bits represent redundant bits for error correction).

In one embodiment, the BOOST+4 bit flash ADC unit 103 does not include the adaptive linear equalizer (AEQ).

The output of AEQ+4 bit flash ADC unit 103 is input to 7-bit folding & interpolation unit 102. The 7-bit folding & interpolation unit 102 performs capacitive folding and capacitive interpolation on the output of AEQ+4 bit flash ADC unit 103. The capacitive folding and interpolation is described in greater detail below. The result of the folding and interpolation is output to decoding unit 101. In one embodiment, that output is 64 bits-wide.

Decoding unit 101 receives the output from 7-bit folding & interpolation unit 102 along with an output from AEQ+4 bit flash ADC unit 103. In one embodiment, AEQ+4 bit flash ADC unit 103 outputs 2 bits to decoding unit 101 and 7-bit folding and interpolation unit outputs 64 bits, to create a 66 bit input to decoding unit 101. In response to the inputs, decoding unit 101 performs decoding and generates output signal 111 in a manner well-known in the art. In one embodiment, output signal 111 is 9 bits.

Figure 2:
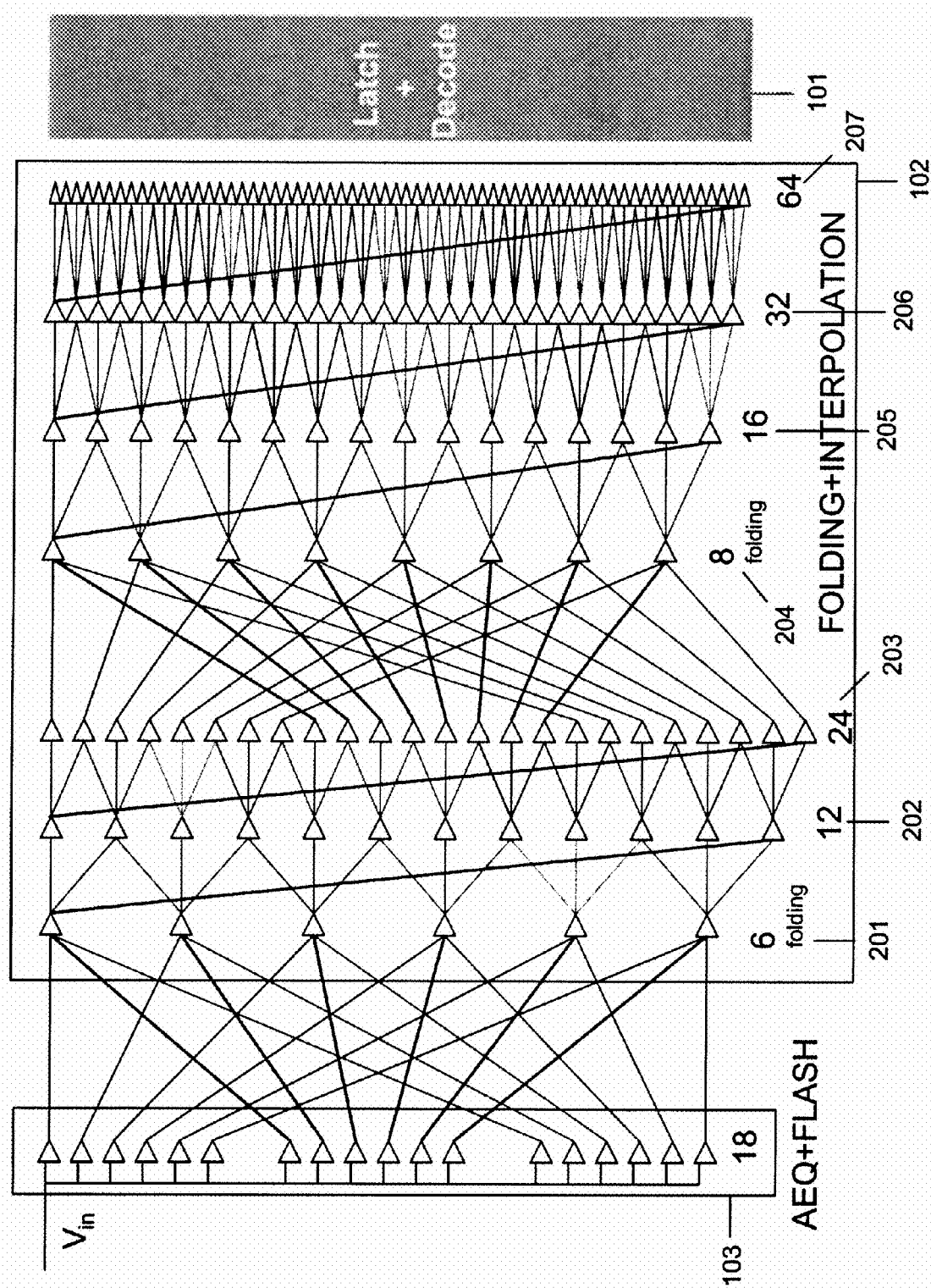
FIG. 2 is a more detailed view of a 7-bit folding & interpolation block.

FIG. 2 is a more detailed view of 7-bit folding & interpolation unit 102, in conjunction with the AEQ+flash unit and the decoding unit, to illustrate the pipelined architecture. Referring to FIG. 2, folding interpolation unit 102 comprises a first set of six capacitive folders 201, a first set of twelve capacitive interpolators 202, a second set of twenty-four capacitive interpolators 203, a second set of eight capacitive folders 204, a third set of sixteen capacitive interpolators 205, a fourth set of thirty-two capacitive interpolators 206, and a fifth set of sixty-four capacitive interpolators 207, and their associative connections. Each of the capacitive folders and interpolators are described below in more detail.

In one embodiment, inputs of each of the capacitive folders 201 are coupled to receive three outputs from the AEQ+flash unit 103, such that each output AEQ+flash unit 103 is only coupled to one of the inputs of one of capacitive folders 201. Each of folders 201 generates an output that is coupled to inputs of three different capacitive interpolators 202. The capacitive interpolators 202 perform capacitive interpolation and generate an output that is coupled to an input of three different capacitive interpolators 203. The 24 outputs of capacitive interpolators 203 are coupled to inputs of capacitive folders 204, such that each of capacitive folders 204 receives three inputs, each from distinct outputs of capacitive interpolators 203.

Each of capacitive folders 204 performs capacitive folding on its inputs to create an output, which are coupled to inputs of three distinct capacitive interpolators 205. Each of capacitive interpolators 205 performs capacitive interpolation on its inputs to produce a single output. The single output is coupled to inputs of three distinct capacitive interpolators 206. Capacitive interpolators 206 perform capacitive interpolation to generate an output, which is coupled to inputs of three distinct capacitive interpolators 207. Capacitive interpolators 207 perform capacitive interpolation on its inputs and produce 64 outputs that are latched and decoded by decoding unit 101.

As described in FIG. 2, the capacitive folding and interpolation is segmented into different stages and all are controlled with a clock. By using different stages, sampling occurs into the next stage after the previous folding stage or interpolation is done. In this manner, the signals are processed through multiple stages in a pipelined manner.

Note that in FIG. 2, the capacitive interpolators have two input terminals and those shown receiving one input are receiving the same inputs on both input terminals (i.e., the input is coupled to both input terminals).

Figure 3B:
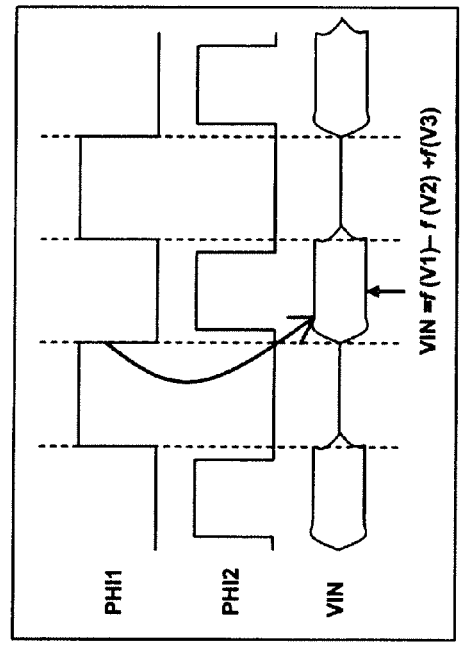
FIG. 3B illustrates the relationship between the clock signals PHI1 and PH12 with respect to VIN for the capacitive interpolator of FIG. 3A.
Figure 3A:
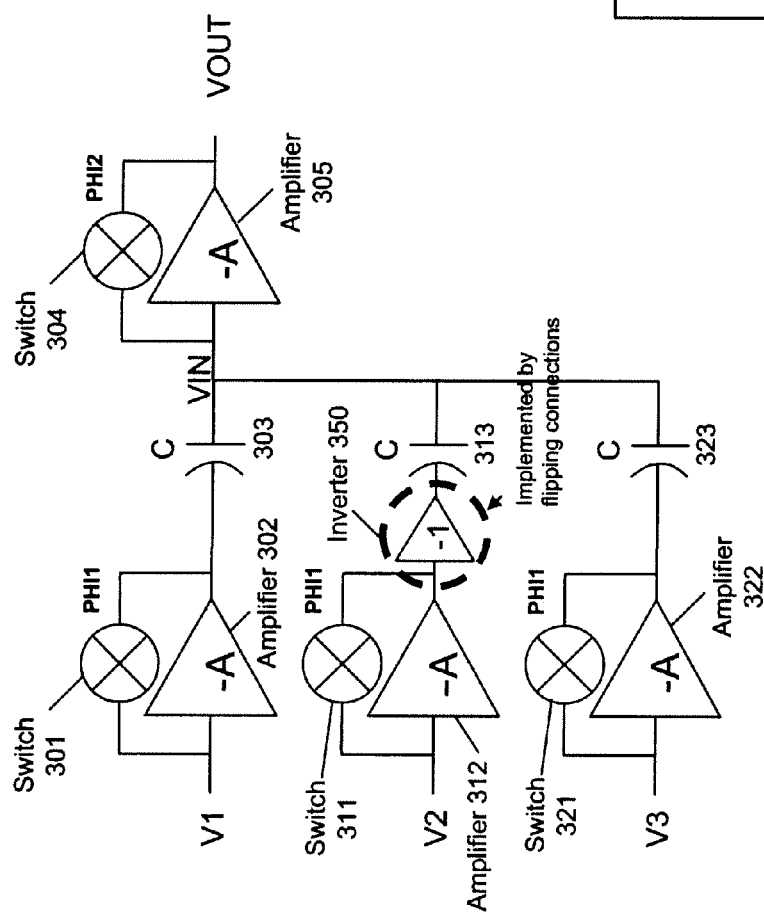
FIG. 3A illustrates a capacitive folder.

FIG. 3A illustrates a capacitive folder, such as may be used in folding and interpolation unit 102 of FIGS. 1 and 2. Referring to FIG. 3A, the capacitive folder has three voltage inputs V1-V3 and produces a voltage output VOUT. In one embodiment, the input voltages V1-V3 and the output voltage VOUT are differential signals. Each of the voltages V1-V3 is coupled to an input of an amplifier having a gain and one terminal of a switch. In one embodiment, the switches are for holding charge (as a battery).

More specifically, voltage V1 is coupled to the input of amplifier 302 and one terminal of switch 301, the voltage V2 is coupled to the input of amplifier 312 and one terminal of switch 311, and voltage V3 is coupled to the input amplifier 322 and one terminal of switch 321. In one embodiment, each of amplifiers 302, 312 and 322 apply the same gain. Switches 301, 311 and 321 are controlled by the PHI1 clock signal.

The output of each amplifier and the other terminal of each switch are coupled to a capacitor. That is, the second terminal of switch 301 and the output of amplifier 302 is coupled to one side of capacitor 303, and the second terminal of switch 321 and the output of amplifier 322 is coupled to one side of capacitor 323. However, the second terminal of switch 311 and the output of amplifier 312 is coupled to the input of inverter 350, which inverts those outputs. That is, in one embodiment, as its inputs are differential signals, inverter 350 is implemented by flipping connections of the differential pair. The output of inverter 350 is coupled to one side of capacitor 313.

The opposite sides of capacitors 303, 313 and 323 are coupled to node at VIN, which is coupled to the input of amplifier 305 and one terminal of switch 304. Switch 304 is controlled by the PHI2 clock signal. The output second terminal of switch 304 and the output of amplifier 305 is coupled as the output voltage VOUT. Thus, there is a cascaded arrangement in which the amplifier/switch pairs coupled to the input voltages are cascaded with amplifier 305. Each pair receives a corresponding clock signal PHI1 and PHI2, with switches 301, 304, 311 and 321 being used as feedback elements.

FIG. 3B illustrates the relationship between the clock signals PHI1 and PHI2 with respect to VIN. Referring to FIG. 3B, at the point when the PHI1 clock pulse is at its lowest point and the PHI2 clock pulse is at its highest point, the VIN is equal to f(V1)−f(V2)+f(V3).

Thus, the capacitor folder implementation uses capacitor charge sharing with two inputs coupled positively and the other input coupled negatively.

Figure 4B:
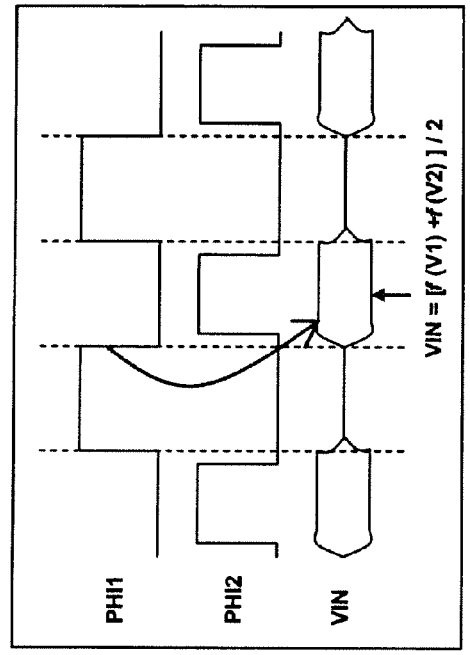
FIG. 4B illustrates the relationship between the clock signals PHI1 and PHI2 with respect to the VIN for the capacitive interpolator of FIG. 4A.
Figure 4A:
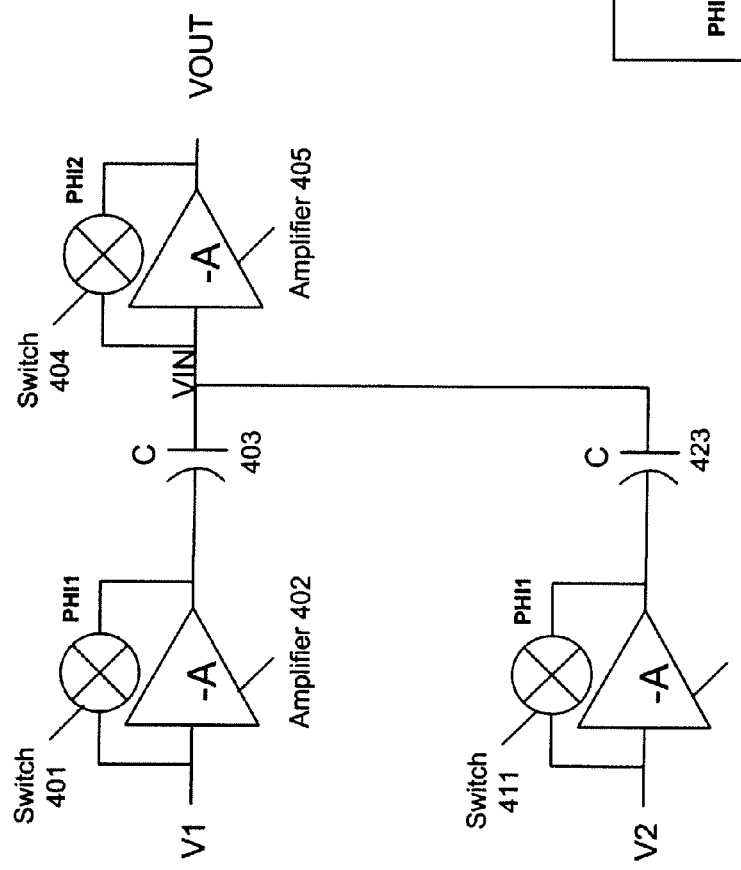
FIG. 4A illustrates one embodiment of a capacitive interpolator.

FIG. 4A illustrates one embodiment of a capacitive interpolator. Referring to FIG. 4A, the capacitive interpolator includes two inputs V1 and V2 to produce an output VOUT. In one embodiment, the input voltage V1 and V2 and the output voltage VOUT are differential signals. Each of the voltages is coupled to an input of an amplifier and one terminal of a switch. More specifically, voltage V1 is coupled to the input of amplifier 402 and the first terminal of switch 401, the voltage V2 is coupled to the input of amplifier 412 and the first terminal of switch 411. In one embodiment, each of amplifiers 402 and 412 apply the same gain. Amplifier 405 can have some other gain value.

The second terminal of both switches 401 and 411 and the outputs of amplifiers 402 and 412 for each of the voltages are coupled to a capacitor. More specifically, the second terminal of switch 401 and the output of amplifier 402 are coupled to one side of capacitor 403 and the second terminal of switch 411 and the output of amplifier 412 are coupled to one side of capacitor 423.

The opposite side of capacitors 403 and 423 are coupled to a node labeled VIN, which is coupled to the input of amplifier 405 and first terminal of switch 404. The second terminal of switch 404 and the output of amplifier 405 is the output voltage VOUT. Thus, the capacitive interpolation is performed using a very similar cascaded arrangement to that of the capacitive folder.

FIG. 4B illustrates the relationship between the clock signals PHI1 and PH12 with respect to the VIN. Referring to FIG. 4B, at the point when the PHI1 clock pulse is at its lowest point and the PHI2 clock pulse is at its highest point, VIN is equal to [f(V1)+f(V2)]/2.

Figure 5:
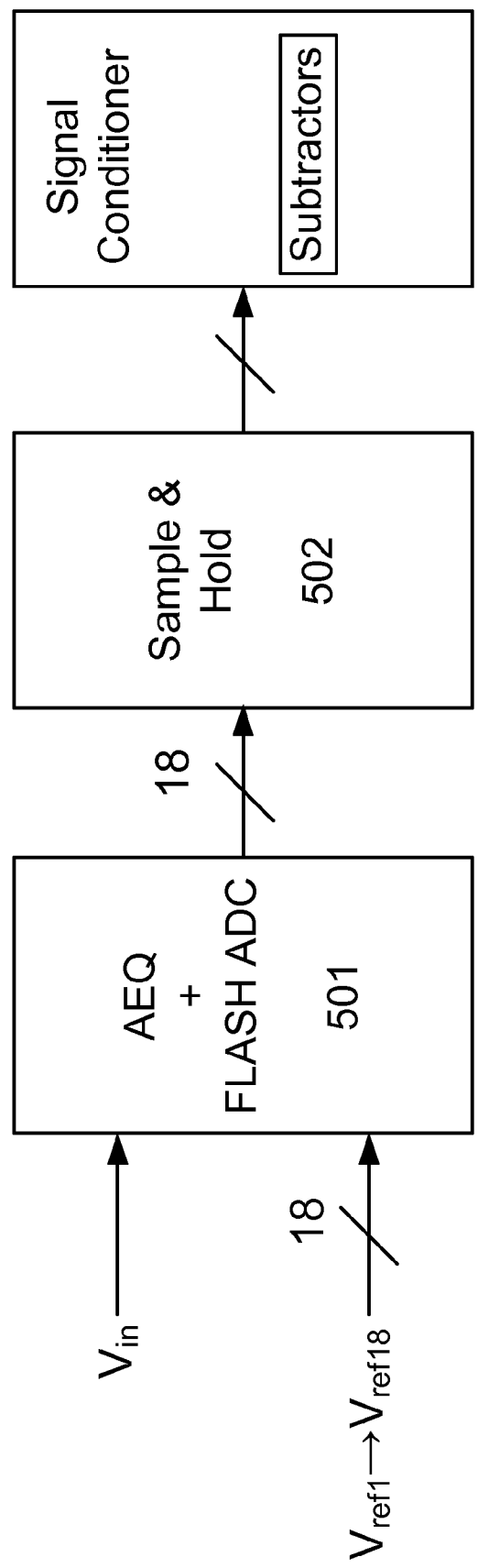
FIG. 5 illustrates one embodiment of a AEQ+4-Bit flash ADC 103.

FIG. 5 illustrates one embodiment of the AEQ+4-Bitflash ADC 103 of FIG. 1. Referring to FIG. 5, AEQ+flash ADC 501 is coupled to receive the input voltage $V_{in}$ along with multiple reference voltages. In one embodiment, 18 reference voltages are received, referred to herein as $V_{ref1}$-$V_{ref18}$. AEQ+flash ADC 501 receives the voltages and uses a set of comparators to directly measure an analog signal.

The signals output from AEQ+flash ADC 501 are stored and held by sample and hold circuits 502. In one embodiment where the output of AEQ+flashADC 501 is 18 output signals, one for each of the subtractions of the voltage references $V_{ref1}$-$V_{ref18}$ from $V_{in}$, there are 18 sample and hold circuits in sample and hold circuits 502 to store the signals. The outputs of sample and hold block 502 are output from the AEQ+flash ADC unit 103.

By subtracting the voltage references $V_{ref1}$-$V_{ref18}$ from $V_{in}$ and only process the difference, a much higher input dynamic range can be achieved with this ADC while maintaining good linearity. This is a major limitation for folding and other types of ADC. The input linearity requirements for this architecture after the subtraction are only a fraction of the full input voltage.

In a conventional AEQ+flash ADC, the AEQ provides a transfer function G(f) to the voltage input to voltage $V_{IN}$ to create a voltage out $V_O$ according to the equation $$V_0 = G(f)V_{IN}$$

at the same peak-to-peak voltage, followed by the flash ADC creating a series of outputs based on a subtraction of various reference voltages $V_{ref}$ from $V_0$, namely $$V_{D17} = G(f)[V_0 - V_{REF17}]$$
$$V_{D16} = G(f)[V_0 - V_{REF16}]$$
$$V_{D15} = G(f)[V_0 - V_{REF15}]$$
$$\square$$
$$\square$$
$$\square$$
$$V_{D0} = G(f)[V_0 - V_{REF0}]$$

The present invention recognizes that when correcting for insertion loss of long cables the transfer function may be written such that $V_{REFx}$ is equal to $G(f)V_{REFx}$, then the equations may be re-written as follows. In other words, at low frequency, $G(f)V_{ref}$ goes to one. Thus, the individual outputs represent the AEQ transfer function multiplied by the difference between the voltages $V_{in}$ and $V_{ref}$ associated with the output signal. In other words, the AEQ+flash ADC generates outputs based on the equation $G(f)(V_{in}-V_{ref})$. As set forth above, in one embodiment where there are 18 outputs, referred to as $V_{D[17:0]}$, the outputs are the following:

$$V_{D17} = G(f)[V_{in} - V_{REF17}]$$
$$V_{D16} = G(f)[V_{in} - V_{REF16}]$$
$$V_{D15} = G(f)[V_{in} - V_{REF15}]$$
$$\square$$
$$\square$$
$$\square$$
$$V_{D0} = G(f)[V_{in} - V_{REF0}]$$

Figure 6:
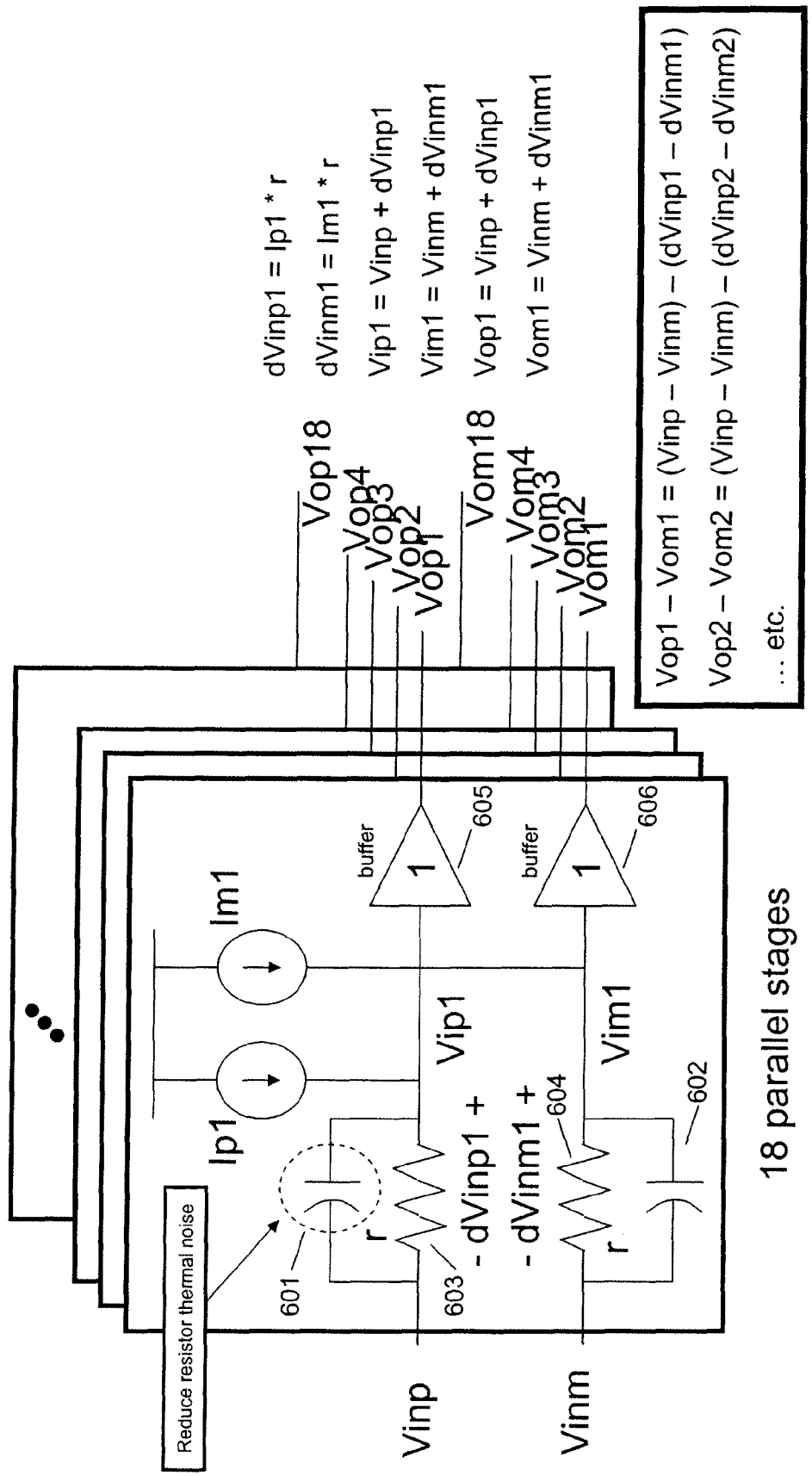
FIG. 6 illustrates one embodiment of a first stage of a flash ADC.

FIG. 6 illustrates one embodiment of the first stage of the 4-bit flash ADC 501 of FIG. 5. This first stage generates the $V_{in}$ and $V_{REF}$ voltages for the subtraction for each of the 18 parallel stages that drive the 18 sample and holds. That is, the outputs of each of the stages are input into a subtractor that subtracts the values. In one embodiment, the subtraction is done using currents that are scaled for different buffer cells.

In one embodiment, each of the 18 parallel stages is implemented as a source follower that uses signal swings that is very small (e.g., 0.2 volts), which helps the source follower to be linear. In this manner, the source follower may go up to 7-8 bit accuracy.

Referring to FIG. 6, each of the 18 parallel stages receives a $V_{int}$ and $V_{inm}$ voltages as inputs, which are used to create a voltage drops, $-dVinp1$ and $-dVinm1$, respectively, across resistors 603 and 604, respectively. The voltage drops are as follows:

$$dVinp1 = Ip1 * r$$

$$dVinm1 = Im1 * r$$

As set forth, the voltage drops are based on currents Ip1 and Im1 from current sources. At the node between resistor 603 and buffer 605, the voltage Vip1 is equal to:

$$Vip1 = Vinp = dVinp1$$

The voltage at the node between resistor 604 and buffer 606, Vimn1 is equal to:

$$Vim1 = Vinm + dVinm1$$

Buffers 605 and 606 are unity gain buffers that receive the signals having voltages Vip1 and Vim1. Buffer 605 outputs the signal as signal with voltage Vop1 equal to:

$$Vop1 = Vinp + dVinp1$$

The output of buffer 606 is a signal with voltage Vom1 equal to:

$$Vom1 = Vinm + dVinm1$$

Note that the gain accuracy of the buffer in this arrangement is not of particular importance. As long as all 18 buffers are roughly matched (within 5%), the absolute value of the gain does not matter, as this absolute value of the gain simply gets grouped into the overall gain of the ADC processing. A simple single or two stage source follower can be used as a result of the lack of gain accuracy requirements.

In one embodiment, the common mode voltage of the buffer can be very low. In one embodiment, the common mode voltage need only be high enough to allow a 0.2 Vpp swing. Also, note that this structure can accommodate a large range of input common mode. The current $I_{pn}$ and $I_{mn}$ may be adjusted for a common mode shift. The only requirement is for the previous stage to have current sinking capabilities. The large resistors (e.g., for ohms) are used to minimize this current.

Note that the capacitors are coupled in parallel to the resistors to reduce resistor thermal noise. Specifically, capacitor 601 is coupled in parallel with resistor 603 and capacitor 602 is coupled in parallel with resistor 604. Thus, these large capacitors do not affect the signal transfer function because it is much larger than the input capacitance of the 1× buffer. Note though that capacitor size is large enough so that the input capacitance of the buffer is much smaller than this value.

The calibration of the ADC can be applied easily into this first stage. The DC offset of the buffers and the offset due to the remaining portion of the ADC can be adjusted by tuning the current sources $IP_N$ and $IM_N$.

The output of the first stage are subtracted from each other to produce the inputs to the sample and holds. Each of the subtractions may be represented as the following:

$$Vop1-Vom1=(Vinp-Vinm)-(dVinp1-dVinm1)$$

$$Vop2-Vom2=(Vinp-Vinm)-(dVinp2-dVinm2)$$

... etc.

Using this technique, a large voltage range may be divided into smaller sections by subtracting the input from a number of reference voltages. This decreases the linearity requirement for the circuit implementation for the signal conditioning. Using the above approach, the linearity requirement of 0.2 volts $PPV_{PP}$/slice may be met for the AEQ.

In one embodiment, the sample and hold circuits store the 18 different samples. The data then continues on to the capacitor folding and interpolation described above.

Thus, using the sample and hold circuits, each with a built in gain, along with six 3-1 folders and two levels of capacitive interpolations associated with each, the arrangement provides a pipelined A to D conversion.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

The invention claimed is:

1. An apparatus comprising a multistage pipelined analog-to-digital converter having:
   a folding and interpolation unit coupled to receive and combine a plurality of preamplified signals using capacitive folding and capacitive interpolation;
   a decoding unit coupled to decode the output signals from the folding and interpolation unit; and
   a signal conditioner coupled to the folding and interpolation unit, the signal conditioner comprising:
      an input to receive a signal with an input voltage;
      a plurality of subtractors to subtract in parallel the input voltage from a plurality of reference voltages to produce a plurality of voltage differences; and
      a plurality of signal conditioning circuits coupled to individual differences voltages to perform signal conditioning on the individual difference voltages.

2. The apparatus defined in claim 1 wherein the capacitive folding combines the plurality of preamplified signals using a first set of capacitive folders, wherein each capacitive folder has a node charged by a plurality of capacitors using capacitive charge sharing in which first and second inputs are coupled to their respective capacitors charging the node and the third input is coupled negatively by an inverter to its respective capacitor charging the node.

3. The apparatus defined in claim 2 wherein the third input is a differential signal and is coupled negatively by having its connections with respect to its respective capacitor flipped with respect to the connections of the first and second inputs to their respective capacitors.

4. The apparatus defined in claim 1 further comprising a plurality of sample and hold circuits coupled to the folding and interpolation unit to store the plurality of preamplified signals generated from input signals and provide the plurality of preamplified signals to the folding and interpolation unit.

5. The apparatus defined in claim 4 wherein the plurality of sample and hold circuits, the folding and interpolation unit and the decoding unit operate in a pipelined manner to convert the input signals from analog input voltages to digital outputs.

6. The apparatus defined in claim 1 wherein the capacitive folding combines the plurality of preamplified signals using a first set of capacitive folders, wherein at least one of the capacitive folders comprises:
   a first amplifier coupled in parallel with a first switch between a voltage input and one side of a first capacitor, the other side of the first capacitor being coupled to a node;
   a second amplifier coupled in parallel with a second switch between the voltage input and one side of a second capacitor, the other side of the second capacitor being coupled to the node, wherein an output is a differential signal and is coupled negatively to the second capacitor by having its connections flipped with respect to the connections of outputs of the first and third amplifiers to their respective capacitors;
   a third amplifier coupled in parallel with a third switch between the voltage input and one side of a third capacitor, the other side of the third capacitor being coupled to the node;
   a fourth amplifier coupled in parallel with a fourth switch between the node and a voltage output.

7. The apparatus defined in claim 1 wherein a folding and interpolation unit comprises:
   a first set capacitive folders having inputs coupled to plurality of preamplified signals;
   a first set of capacitive interpolators coupled to outputs of the first set of capacitive folders;
   a second set of capacitive interpolators coupled to outputs of the first set of capacitive interpolators;
   a second set capacitive folders having inputs coupled to outputs of the second set of capacitive interpolators;
   a third set of capacitive interpolators coupled to outputs of the second set of capacitive folders; and
   a fourth set of capacitive interpolators coupled to outputs of the third set of capacitive interpolators.

8. A method comprising:
   storing a plurality of preamplified signals generated from input signals;
   performing capacitive folding and capacitive interpolation to combine the plurality of preamplified signals into a plurality of output signals, wherein the capacitive folding and capacitive interpolation is performed by a folding and interpolation unit comprising:
      a first set of capacitive folders having inputs coupled to the plurality of preamplified signals;
      a first set of capacitive interpolators coupled to outputs of the first set of capacitive folders;
      a second set of capacitive interpolators coupled to outputs of the first set of capacitive interpolators;
      a second set of capacitive folders having inputs coupled to outputs of the second set of capacitive interpolators;
      a third set of capacitive interpolators coupled to outputs of the second set of capacitive folders; and
      a fourth set of capacitive interpolators coupled to outputs of the third set of capacitive interpolators; and
   decoding the plurality of output signals.

9. The method defined in claim 8 wherein storing the plurality of preamplified signals, performing capacitive folding and capacitive interpolation, and decoding the output signals occur in a pipelined manner to convert the input signals from analog input voltages to digital outputs.

10. The method defined in claim 8 wherein the capacitive folding combines the plurality of preamplified signals using a first set of capacitive folders, wherein each capacitive folder has a node charged by a plurality of capacitors using capacitive charge sharing in which first and second inputs are coupled to their respective capacitors charging the node and the third input is coupled negatively by an inverter to its respective capacitor charging the node.

11. The method defined in claim 10 wherein the third input is a differential signal and is coupled negatively by having its connections with respect to its respective capacitor flipped with respect to the connections of the first and second inputs to their respective capacitors.

12. The method defined in claim 8 further comprising performing signal conditioning by
   receiving a signal with an input voltage;
   subtracting, in parallel the input voltage from a plurality of reference voltages to produce a plurality of voltage differences; and
   conditioning individual difference voltages in parallel.

13. An apparatus comprising a multistage pipelined analog-to-digital converter having:
   means for storing a plurality of preamplified signals generated from input signals;
   means for performing capacitive folding and capacitive interpolation to combine a plurality of preamplified signals into output signals, wherein the means for performing capacitive folding and capacitive interpolation comprises a first set of capacitive folders, wherein each capacitive folder has a node charged by a plurality of capacitors using capacitive charge sharing in which first and second inputs are coupled to their respective capacitors charging the node and the third input is coupled negatively by an inverter to its respective capacitor charging the node, wherein the third input is a differential signal and is coupled negatively by having its connections with respect to its respective capacitor flipped with respect to the connections of the first and second inputs to their respective capacitors; and
   means for decoding the output signals, wherein the means for storing, means for performing capacitive folding and capacitive interpolation, and means for decoding operate in a pipelined manner to convert the input signals from analog input voltages to digital outputs.

14. The apparatus defined in claim 13 further comprising a signal conditioner coupled to the plurality of sample and hold circuits, the signal conditioner comprising:
   an input to receive a signal with an input voltage;
   a plurality of subtractors to subtract in parallel the input voltage from a plurality of reference voltages to produce a plurality of voltage differences; and
   a plurality of signal conditioning circuits coupled to individual difference voltages to perform signal conditioning on the individual difference voltages.

15. An apparatus comprising a multistage pipelined analog-to-digital converter having:
   a signal conditioner coupled to the plurality of sample and hold circuits, the signal conditioner having
      an input to receive a signal with an input voltage,
      a plurality of subtractors to subtract in parallel the input voltage from a plurality of reference voltages to produce a plurality of voltage differences, and
      a plurality of signal conditioning circuits coupled to individual difference voltages to perform signal conditioning on the individual differences voltages to generate a plurality of preamplified signals;
   a plurality of sample and hold circuits to store the plurality of preamplified signals generated from input signals;
   a folding and interpolation unit coupled to the plurality of sample and hold circuits; and
   a decoding unit coupled to decode the output signals from the folding and interpolation unit, the plurality of sample and hold circuits, the folding and interpolation unit and the decoding unit operating in a pipelined manner to convert the input signals from analog input voltages to digital outputs.

* * * * *